United States Patent
Herrmann et al.

(12)
(10) Patent No.: US 6,192,094 B1
(45) Date of Patent: Feb. 20, 2001

(54) DIGITAL PHASE-FREQUENCY DETECTOR

(75) Inventors: Helmut Herrmann; Stefan Herzinger, both of München (DE)

(73) Assignee: Infineon Technologies AG, Munich (DE)

( * ) Notice: Under 35 U.S.C. 154(b), the term of this patent shall be extended for 0 days.

(21) Appl. No.: 09/470,622

(22) Filed: Dec. 22, 1999

(30) Foreign Application Priority Data

Dec. 22, 1998 (DE) .............................. 198 59 515

(51) Int. Cl.$^7$ .............................. H03D 3/24; H03D 13/00
(52) U.S. Cl. .............................. 375/375; 375/376; 327/157; 327/158
(58) Field of Search .............................. 375/375, 340, 375/376; 327/147, 148, 149, 156, 157, 158

(56) References Cited

U.S. PATENT DOCUMENTS 4,322,643 * 3/1982 Preslar .............................. 307/528
4,378,509 * 3/1983 Hatchett et al. .............................. 307/528
5,805,002 * 9/1998 Ruetz .............................. 327/159
5,892,380 * 4/1999 Quist .............................. 327/172
6,100,721 * 8/2000 Durec et al. .............................. 327/3

FOREIGN PATENT DOCUMENTS

3116603C2    12/1990 (DE) .

* cited by examiner

*Primary Examiner*—Temesghen Ghebretinsae
(74) *Attorney, Agent, or Firm*—Herbert L. Lerner; Laurence A. Greenberg; Werner H. Stemer

(57) ABSTRACT

In a digital phase-frequency detector with anti-backlash pulses, which prevent the mapping of very short correction pulses occurring on the basis of small phase differences by use of an AND logic circuit controlling the RESET of two flip flop circuits, a waste time is shortened by reducing a duration of the RESET pulse. The integrable phase-frequency detector according to the invention can be used in fast digital phase-locked control loops, for example for tuners, frequency synthesizers in the field of mobile radio.

9 Claims, 5 Drawing Sheets

DIGITAL PHASE-FREQUENCY DETECTOR

BACKGROUND OF THE INVENTION

1. Field of the Invention

The invention relates to a digital phase-frequency detector formed of two flip-flops generating digital output signals received by a charge pump. A feedback path formed of an AND gate and a delay device receives the digital output signals and generates a modified signal received by reset inputs of the two flip-flops.

Such a phase-frequency detector is used in a conventional digital phase-locked control loop. The digital phase-locked control loop includes three function modules, specifically a digital phase detector, an analog loop filter and a voltage-controlled oscillator (VCO) and optionally a frequency divider. The controlled variable in each phase-locked control loop is the phase angle.

The phase angle of a first ac signal is compared with the phase angle of a second ac signal. The phase difference between the two signals is determined in the control system and is used to synchronize the two signals.

In the known phase-locked control loop, one ac input signal, which is a reference signal of a given frequency, is compared with a controlled ac input signal of a variable frequency with the aid of the digital phase detector, which supplies a pulsed output current signal which depends on the phase difference between the two input signals.

The resulting output current signal is integrated over time in the analog loop filter, thus producing an output control voltage which actuates the voltage-control oscillator with regard to its frequency setting. The output signal of the voltage-controlled oscillator is the controlled signal, which is fed via the optionally provided frequency divider as the ac signal to the phase detector as one of the two input signals to be compared with regard to their phase angle.

SUMMARY OF THE INVENTION

It is accordingly an object of the invention to provide a digital phase-frequency detector that overcomes the above-mentioned disadvantages of the prior art devices of this general type.

With the foregoing and other objects in view there is provided, in accordance with the invention, a digital phase-frequency detector for generating a pulsed output current. signal dependent on a phase difference between two ac input signals, including;

a first flip flop circuit having a reset input, a set input being fed one of the two ac input signals, and an output outputting digital output pulses that can be tapped as a function of a circuit state of the first flip-flop circuit;

a second flip-flop circuit having a reset input, a set input being fed another one of the two ac input signals, and an output outputting digital output pulses that can be tapped as a function of a circuit state of the second flip-flop circuit;

an AND logic circuit receiving the digital output pulses of the first and the second flip flop circuits and having an output outputting modified digital output pulses;

a delay device receiving the modified digital output pulses from the AND logic circuit and outputting a delay device signal received by the reset inputs of the first and second flip-flop circuits, the delay device increases a minimum duration of the modified digital output pulses by an anti-backlash pulse width given a presence of small phase differences between the two ac input signals, the delay device having a first delay path and a second delay path disposed parallel to one another, the first delay path assigned to positive edges of the modified digital output pulses coming from the output of the AND logic circuit and having a delay time unchanged by comparison with an original delay time, that is to say has a duration of the anti-backlash pulse, the second delay path assigned to negative edges of the modified digital output pulses coming from the output of the AND logic circuit and delays the negative edges by a delay time dimensioned to be only so long that the first and second flip-flop circuits being reliably reset; and a charge pump formed of two switchable current sources, including a first current source and a second current source, the first current source supplying a first predetermined current in dependence on the digital output pulses of the first flip-flop circuit, and the second current source draws a second predetermined in dependence on the digital output pulses current from the second flip-flop circuit and the first and second predetermined currents form the pulsed output current signal in a ternary shape in a temporal variation.

It is the object of the invention to specify measures by which the disturbing waste time of the digital phase-frequency detector operating with anti-backlash pulses is shortened so that a digital phase-locked control loop fitted with such a phase-frequency detector has an improved settling response. The waste time of the digital phase-frequency detector with anti-backlash pulses is yielded in general from three components, specifically from the duration of the anti-backlash pulse, from the sum of the gate transit times between the digital output pulse states UP=DN=1 and the cancellation of the RESET and from the duration of the RESET pulse.

The duration of the anti-backlash pulse is fixed by the time which is required in order to represent the anti-backlash pulse (digital output pulses, the current source and the current sink in the charge pump) completely with rising edge, adequate settling phase and falling edge.

It is true that for a given circuit topology, this duration is determined by the technology and cannot be further shortened, The sum of the gate transit times between the digital output pulse states UP=DN=1 and the cancellation of the RESET can indeed be shortened by using fast logic blocks and an optimized circuit topology. By contrast, the measures specified by the invention amount to a reduction in the RESET pulses.

It is important in this case that, just as in the prior art, the RESET is applied with a delay upon the transition of the digital output pulse UP,DN→logic state "1", in order to set the width of the anti-backlash pulse, but that upon the transition of the digital output pulse UP,DN→logic state "0" the delay time specified by the actual delay path is circumvented, in order as quickly as possible to cancel the RESET and thus to shorten the waste time of the digital phase-frequency detector.

Other features which are considered as characteristic for the invention are set forth in the appended claims.

Although the invention is illustrated and described herein as embodied in a digital phase-frequency detector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
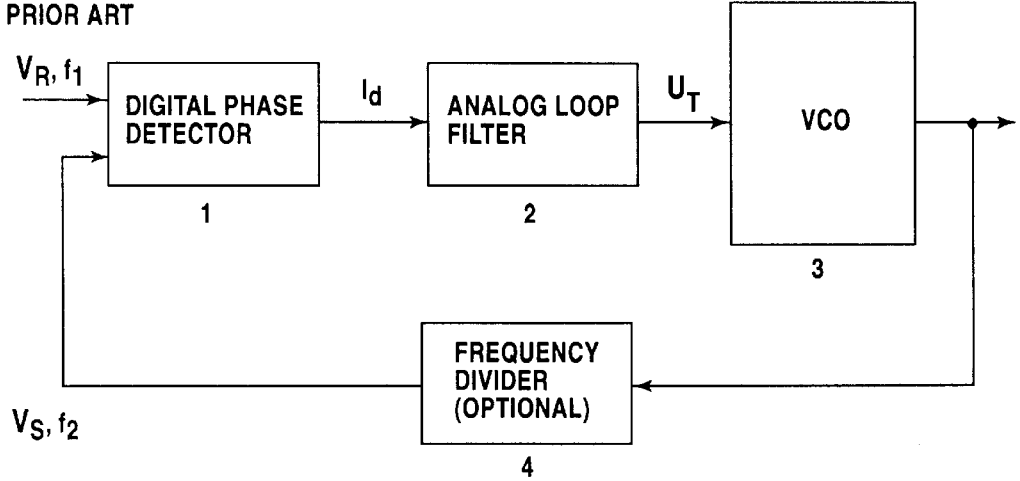
FIG. 1 is a block diagram of a digital phase-locked control loop according to the prior art.

In all the figures of the drawing, sub-features and integral parts that correspond to one another bear the same reference symbol in each case. Referring now to the figures of the drawing in detail and first, particularly, to FIG. 1 thereof, there is shown a phase-frequency detector that is used in a conventional digital phase-locked control loop. The digital phase-locked control loop includes three function modules, specifically a digital phase detector 1, an analog loop filter 2 and a voltage-controlled oscillator (VCO) 3 and optionally a frequency divider 4. The controlled variable in each phase-locked control loop is the phase angle.

The phase angle of a first ac signal is compared with the phase angle of a second ac signal. The phase difference between the two signals is determined in the control system and used to synchronize the two signals, In the known phase-locked control loop represented in FIG. 1, one ac input signal $V_R$, which is a reference signal of the frequency $f_1$, is compared with a controlled ac input signal $V_S$ of variable frequency $f_2$ with the aid of the digital phase detector 1, which supplies a pulsed output current signal $I_d$ which depends on the phase difference between the two input signals $V_R$ and $V_S$.

The resulting output current signal $I_d$ is integrated over time in the analog loop filter 2, thus producing an output control voltage $U_T$ which actuates the voltage-control oscillator 3 with regard to its frequency setting. The output signal of the voltage-controlled oscillator 3 is the controlled signal, which is fed via the optionally provided frequency divider 4 as the ac signal $V_S$ to the phase detector 1 as one of the two input signals to be compared with regard to their phase angle.

The single digital block of the phase-locked control loop represented in FIG. 1 is the digital phase detector 1. It is preponderantly the so-called digital phase-frequency detector that is used for this, in addition to other frequently used digital phase detectors such as, for example, EXOR circuits or edge-controlled JK flip flops.

Figure 2:
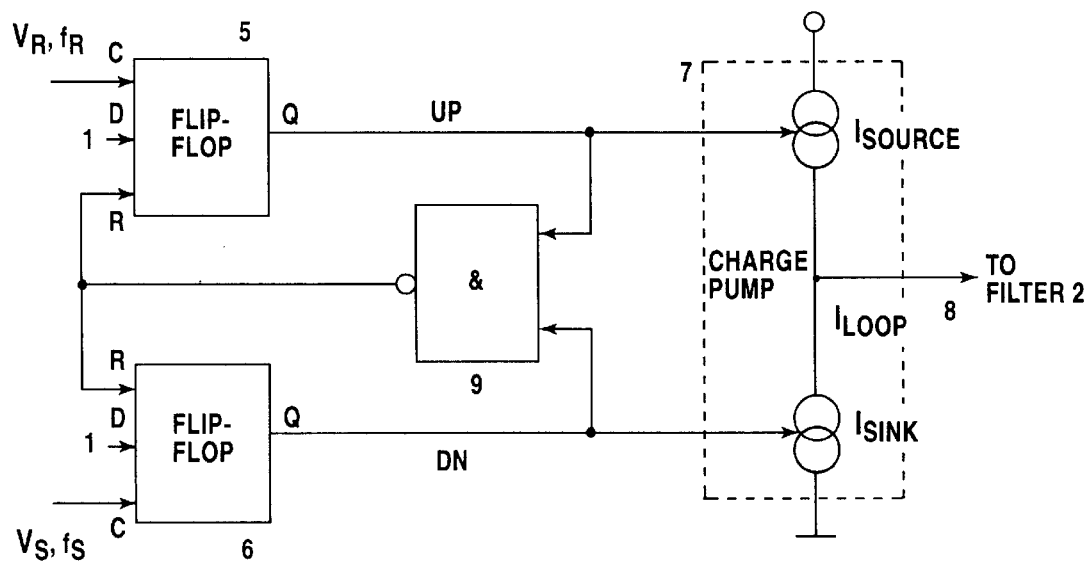
FIG. 2 is a block diagram of an ideal digital phase-frequency detector.

FIG. 2 shows the block diagram of an ideal digital phase-frequency detector. The first ac input Signal $V_R$ of frequency $f_R$ is fed to a C input of a first D flip flop circuit 5 at whose D input a logic 1 is present.

The second ac input signal $V_S$, with the frequency $f_S$, is led to a C input of a second D flip flop circuit 6 at whose D input a logic 1 is likewise present. The output Q of the first flip flop circuit 5 deploys output pulses UP when the phase of the controlled ac input signal $V_S$ lags the phase of the other ac input signal $V_R$, that is to say the reference signal. In the active state, the duration of the digital output pulses UP is proportional to the magnitude of the phase lag.

In a similar way, the output Q of the second flip flop circuit 6 supplies digital output pulses DN when the phase of the controlled ac input signal $V_S$ leads the phase of the other ac input signal $V^R$, that is to say the reference signal. For this case, in the active state the duration of the digital output pulses DN is proportional to the magnitude of the phase lead.

The output signals UP and DN are then given a ternary shape by use of a charge pump 7. The digital output pulses UP actuate a switchable current source $I_{source}$ for feeding current to an output 8. The digital output pulses DN, by contrast, actuate a switchable current sink $I_{sink}$ for drawing current from the output 8.

The resulting output current signal $I_{loop}$, present in a ternary logic shape at the output 8, is then led to the loop filter (not represented in FIG. 2; denoted by 2 in FIG. 1), thus producing an output control voltage which is proportional to the determined time integral of the phase difference between the input signals $V_R$ and $V_S$.

The digital phase-frequency detector is frequently used because, in the locked state of the phase-locked control loop, its output current signal $I_{loop}$ depends on the phase error, whereas in the unlocked state it depends on the frequency error. Consequently, a digital phase-locked control loop with a digital phase-frequency detector is capable of locking even under unfavorable conditions.

Figure 3:
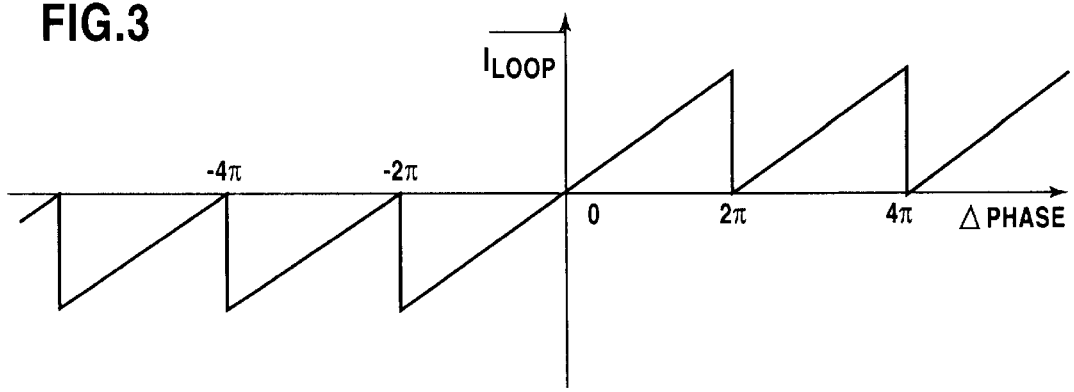
FIG. 3 is a characteristic diagram of the ideal digital phase-frequency detector in a locked state.

Reference is made in this connection to FIG. 3, which shows a characteristic of the ideal digital phase-frequency detector in the locked state, that is to say the dependence of the output current signal $\overline{I_{loop}}$ on the phase difference Δphase between the input signals $V_R$ and $V_S$.

The phase-frequency detector represented in FIG. 2 can have four different states:

UP=0, DN=0;
UP=1, DN=0;
UP=0, DN=1;
UP=1, DN=1.

The last of these states is locked by an additional AND logic circuit 9 whose output is connected via a negation to the reset inputs R of the two flip flop circuits 5 and 6. When the phase-frequency detector comes into this state, the output of the charge pump 7 is switched into the tristate condition.

Figure 4A:
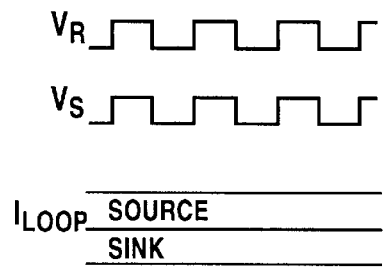
FIGS. 4a, 4b and 4c are diagrams of three pulse characteristic relationships for different phase error ratios in the case of ideal functioning of the digital phase-frequency detector.
Figure 4B:
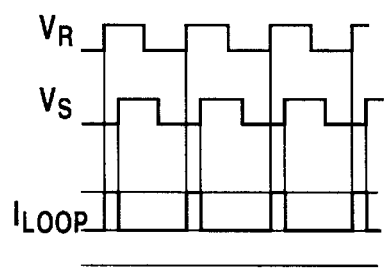
Figure 4C:
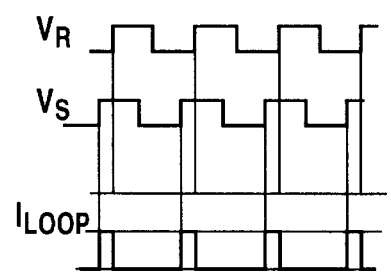

In the case of ideal functioning of the phase-frequency detector illustrated in FIG. 2, the result is the response represented in temporal pulse flow diagrams in FIGS. 4a, 4b and 4c. In this case, the phase error between the input signals $V_R$ and $V_S$ is zero in FIG. 4a. The output 8 of the phase-frequency detector is then of high resistance. in FIG. 4b, the phase error between the input signals $V_R$ and $V_S$ is positive, that is to say the input signal $V_S$ (=signal to be controlled) lags the other input signal $V_R$ (reference signal). The output current signal $I_{loop}$ then consists of positive current pulses. In FIG. 4c, the phase error between the input signals $V_R$ and $V_S$ is negative, that is to say the input signal $V_S$ leads the other input signal $V_R$.

The output current signal $I_{loop}$ then consists of negative current pulses. If the digital phase-locked control loop represented in FIG. 1 were to operate exactly at the reference frequency $f_1$, the output 8 of the phase-frequency detector illustrated in detail in FIG. 2 would be of permanently high resistance. However, since the frequency of the voltage-controlled oscillator 3 actually slowly drifts, the result is firstly a very slight time shift between the edges of the input signals $V_R$ and $V_S$.

The digital phase-locked control loop would now have to generate a very short correction pulse with a duration of, for example, 10 ps. However, since the logic circuits and also the charge pump of the digital phase-frequency detector cannot generate such short pulses, a ripple frequency would be produced precisely in the desired control state and contaminate the signal spectrum in the phase-locked control loop. The period over which the output signal of the phase-frequency detector reacts nonlinearly to the edge spacing (so-called backlash) is around 1 ns, depending on the technology.

In order to eliminate this problem, the introduction of anti-backlash pulses as an approach to a solution is known from German Patent DE 31 16 603 C2. In order to prevent the digital phase-locked control loop from having to map the very short correction pulses in conjunction with small phase differences, a stratagem is applied which is explained in conjunction with FIG. 5 which largely shows the phase-frequency detector represented in FIG. 2, and therefore no longer needs to be described in detail in the corresponding parts.

A delay device 10 is disposed downstream of the logic AND combination of the digital output pulses UP and DN, which is carried out by the AND logic circuit 9 and locks the state UP=1, DN=1 and switches the output 8 directly into the tristate condition. Consequently, this state is permitted up to the delayed RESET. The digital output pulses UP and DN are both HIGH for the duration of the delay effected by the delay device 10, and the current source $I_{source}$ and the current sink $I_{sink}$ of the charge pump 7 are both also active during an anti-backlash pulse. When summed, the two currents yield zero, and no resulting output current signal $I_{loop}$ flows to the output 8, as is also the case for the ideal circuit according to FIG. 2. If the frequency generated in the voltage-controlled oscillator 3 (FIG. 1) now drifts slowly out of phase coincidence, the digital output pulse UP or DN now need only be lengthened by the short duration of, for example, 10 ps. This lengthening is possible with high accuracy, since the critical dynamic processes (rising phase, settling phase, falling phase) with their nonlinearities are already included.

When setting the delay time, it must be taken into account that, on the one hand, the above-mentioned critical dynamic processes should be concluded and, on the other hand, the width of the anti-backlash pulses is dimensioned to be as small as possible, since the range of the mappable phase difference is reduced by the anti-backlash pulse.

Figure 6A:
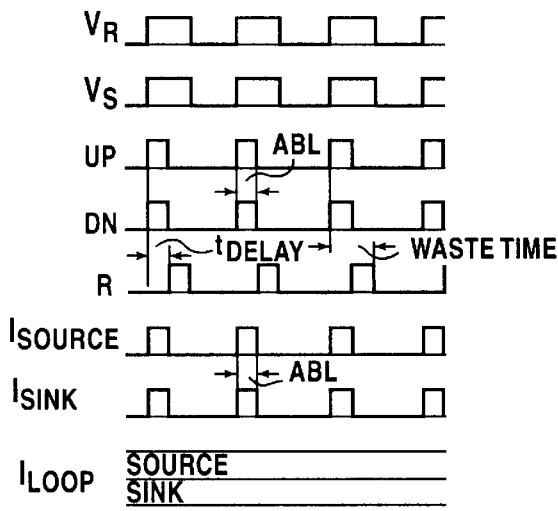
FIGS. 6a, 6b and 6c are diagrams of three pulse characteristic relationships for different phase error ratios in the case of the prior art digital phase-frequency detector according to FIG. 5.
Figure 6B:
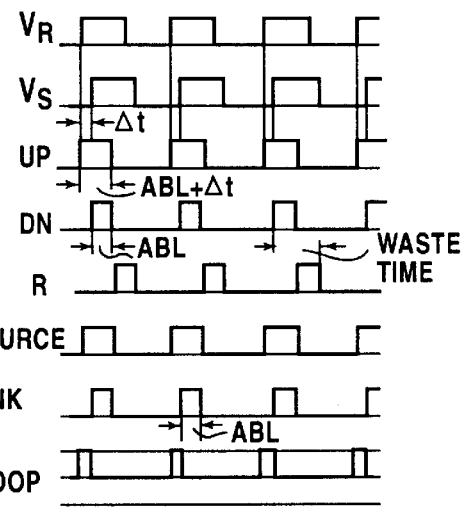
Figure 6C:
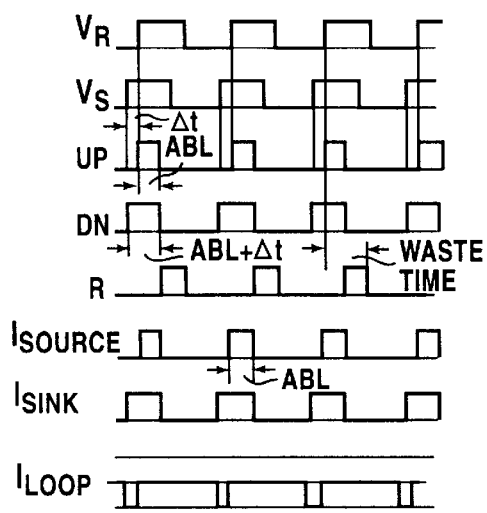

The pulse flow diagrams represented in FIGS. 6a, 6b and 6c show the circuit states for different phase angles. It emerges clearly from this that the range of the mappable phase difference is constricted.

In detail, in FIG. 6a the phase error between the input signals $V_R$ and $V_S$ is zero. The output 8 of the phase-frequency detector is then of high resistance.

In FIG. 6b, the phase error between the input signals $V_R$ and $V_S$ is positive, that is to say the input signal $V_S$ (=signal to be controlled) lags the other input signal $V_R$ (reference signal). The output current signal $I_{loop}$ then consists of positive current pulses.

In FIG. 6c, the phase error between the input signals $V_R$ and $V_S$ is negative, that is to say the input signal $V_S$ leads the other input signal $V_R$. The output current signal $I_{loop}$ then consists of negative current pulses.

Thus, as soon as the AND combination of the digital output pulses UP and DN yields the logic state HIGH, the digital output pulses UP and DN are reset again after a fixed delay time $t_{delay}$. The delay time $t_{delay}$ is set such that the digital output pulses UP and DN as well as the current source $I_{source}$ and the current sink $I_{sink}$ yield exactly the shortest pulse which can be generated with a clean settling phase for the given technology.

After the resetting of the digital output pulses UP and DN, the RESET R at the input of the D flip flop circuits 5 and 6 also becomes LOW again after renewed traversing of the delay device 10 with the delay time $t_{delay}$. The anti-backlash pulse is denoted by ABL in FIGS. 6a, 6b, and 6c.

However, disadvantages arise in the described solution to the backlash problem. Specifically, the digital phase-frequency detector can only process input edges of the two input signals $V_R$ and $V_S$ again once the RESET is removed. The waste time of the digital phase-frequency detector will thus be at least twice the delay time $t_{delay}$ even in the case of idealized consideration. When considering the nonideal case, the duration of the waste time is further lengthened by gate transit times.

In the case of the enhanced $f_T$ frequencies of modern technologies, the reference frequency $V_R$ of a phase-locked control loop can advance into the region>250 MHz. High reference frequencies are preferably used because then distortion products (harmonics, intermodulation products) come to lie far from the signal frequency and can be filtered more easily. This state of affairs is shown by a numerical example specified below:

Reference frequency=250 MHz, reference period 4 ns;
Duration of the anti-backlash pulse (ABL): 0.75 ns
Duration of the RESET pulse: 0.75 ns;
Sum of the gate transit times between UP=DN=1 and isolation of the RESET: 0.5 ns.
Consequently, a waste time of the phase-frequency detector is yielded as: $t_B$=0.75 ns+0.75 ns+0.5 ns=2 ns.

Figure 7:
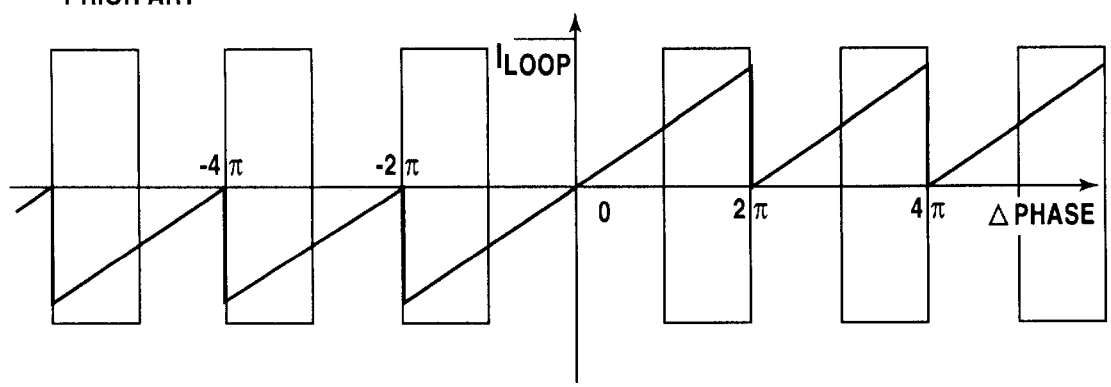
FIG. 7 is a characteristic diagram of the prior art digital phase-frequency detector according to FIG. 5, in a locked state.

Reference may be made in this connection to FIG. 7, which shows a characteristic of the digital phase-frequency detector with anti-backlash pulses for the example specified above, in the locked state, that is to say the dependence of the output current signal $\overline{I_{loop}}$ on the phase difference $\Delta$phase between the input signals $V_R$ and $V_S$. The phase regions bordered by the rectangles cannot be represented because of waste time.

The characteristic, shown in FIG. 3, of the ideal phase-frequency detector is therefore drastically restricted. With increasing waste time, the digital phase-frequency-detector loses more and more of its capacity, which is particularly advantageous per se, of reacting to frequency errors in the unlocked state. The settling time of the digital phase-lock control loop is thereby lengthened.

The critical waste time is reached for a ratio (reference period/waste time) of 2:1. This state is represented in FIG. 7. The settling time from an unlocked state then becomes infinite, and the phase-locked control loop can then no longer settle.

It is the object of the invention to specify measures by which the disturbing waste time of the digital phase-frequency detector operating with anti-backlash pulses is shortened so that a digital phase-locked control loop fitted with such a phase-frequency detector has an improved settling response.

The waste time of the digital phase-frequency detector with anti-backlash pulses is yielded in general from three components, specifically from the duration of the anti-backlash pulse, from the sum of the gate transit times between the digital output pulse states UP=DN=1 and the cancellation of the RESET and from the duration of the RESET pulse.

The duration of the anti-backlash pulse is fixed by the time which is required in order to represent the anti-backlash pulse (digital output pulses UP and DN, current source $I_{source}$ and current sink $I_{sink}$ in the charge pump) completely with rising edge, adequate settling phase and falling edge.

It is true that for a given circuit topology, this duration is determined by the technology and cannot be further shortened. The sum of the gate transit times between the digital output pulse states UP=DN=1 and the cancellation of the RESET can indeed be shortened by using fast logic blocks and an optimized circuit topology. By contrast, the measures specified by the invention amount to a reduction in the RESET pulses.

It is important in this case that, just as in the prior art, the RESET is applied with a delay upon the transition of the digital output pulse UP,DN→logic state "1", in order to set the width of the anti-backlash pulse, but that upon the transition of the digital output pulse UP,DN→logic state "0" the delay time specified by the actual delay path is circumvented, in order as quickly as possible to cancel the RESET and thus to shorten the waste time of the digital phase-frequency detector.

Figure 5:
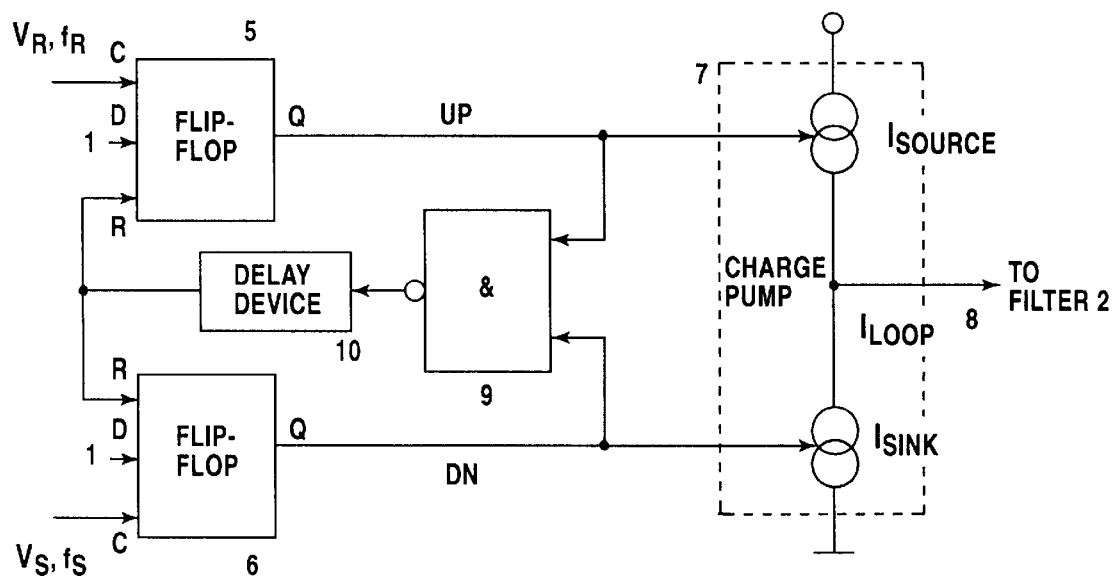
FIG. 5 is a block diagram of a prior art digital phase-frequency detector with an anti-backlash pulse.
Figure 8:
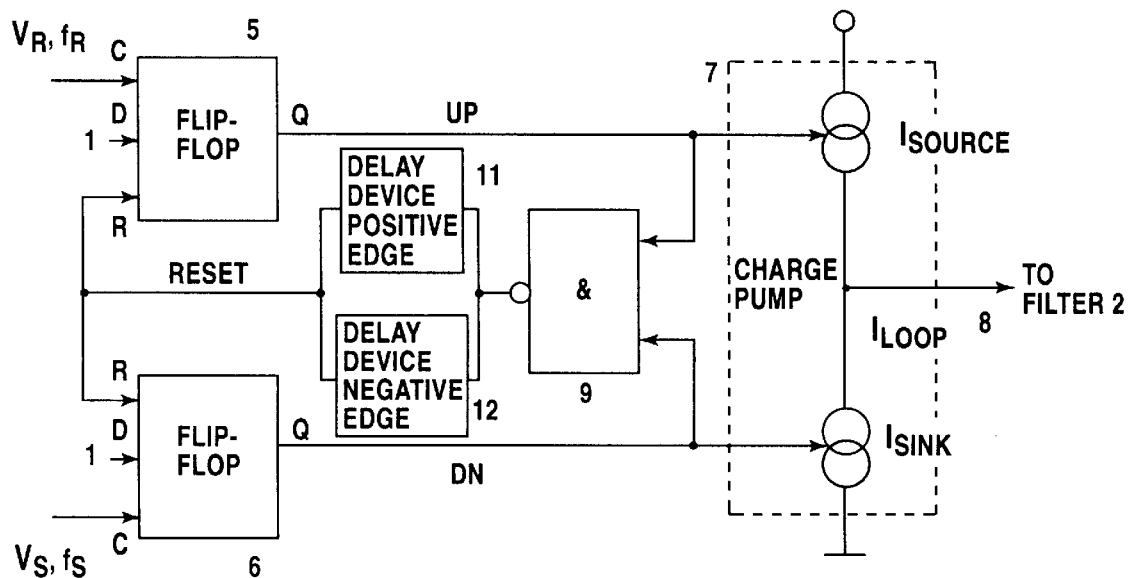
FIG. 8 is a block diagram of a digital phase-frequency detector with the anti-backlash pulse and a shortened RESET according to the invention.

The measures according to the invention for shortening the waste time are explained in conjunction with the circuit represented in FIG. 8, which is constructed on the basis of the phase-frequency detector represented in FIG. 5. FIG. 5 will be described further only in parts required for a better understanding of the invention.

The differences between FIG. 8 and FIG. 5 occur essentially in the construction of the delay paths. It is clear from FIG. 5 that the AND combination of the digital output pulses UP and DN and the AND logic circuit 9 yields the logic state "1" when the two digital output pulse signals UP and DN are simultaneously in the logic state "1". Downstream of the delay device 10 (FIG. 5), which is decisive for the duration of the anti-backlash pulse, the signal is applied in each case as RESET=1 to the reset input R of the two flip flop circuits 5 and 6.

The outputs Q of the two D flip flop circuits 5 and 6 are reset immediately, apart from gate transit times, that is to say a switch is then made to the output pulse states UP=DN="0". This is the trailing edge of the anti-backlash pulse.

The AND combination, effected by the AND logic circuit 9, between the output pulse signals UP and DN, which are both in the logic state "0", once again also yields a logic "0", but the signal RESET does not come into the state "0", until the delay time conditioned by the delay device 10 has elapsed. It is then at the earliest that the phase-frequency detector is once again capable of processing input signal edges. However, this squanders time.

The RESET is shortened by the measures in accordance with the invention to the time which is mandatory in order to reset the two cells of the two D flip flop circuits 5 and 6. The block diagram, represented in FIG. 5, of the digital phase-frequency detector with an anti-backlash pulse is altered for this purpose in accordance with FIG. 8, The circuit represented in FIG. 8 can be used to maintain the width of the anti-backlash pulse and to minimize the RESET pulse width. For this purpose, the block of the delay device 10 from FIG. 5 is taken over into a delay path 11 for positive pulse edges of the output signal of the AND logic circuit 9, in order to keep the duration of the anti-backlash pulses constant.

The negative pulse edges of the output signal of the AND logic circuit 9 experience as short a delay time as possible, which need only be long enough for reliable resetting of the cells of the two D flip flop circuits 5 and 6, and which is fed in FIG. 8 through a second delay path 12 which is disposed parallel to the first delay path 11. In most cases, the gate transit times in the logic cells are already adequate to achieve this short delay time, with the result that there is no need to implement a dedicated second delay path 12 in terms of circuitry.

The advantage flowing from the shortening, produced in accordance with the invention, of the RESET pulse is to be explained below with reference to a numerical example.
Reference frequency=250 MHz, reference period 4 ns;
Duration of the anti-backlash pulse (ABL): 0.75 ns
Duration of the RESET pulse; 0.75 ns;
Sum of the gate transit times between UP=DN=1 and cancellation of the RESET: 0.5 ns.
Consequently, a waste time of the phase-frequency detector is yielded as: $t_B$=0.75 ns+0.75 ns+0.5 ns=2 ns.
Reduction in the reset pulse width to 0.25 ns.
Consequently, a waste time of the phase-frequency detector is yielded as: $t_B$=0.75 ns+0.25 ns+0.5 ns=1.5 ns.

Comparing the two cases on the basis of (reference period/waste time=2:1) yields in advance a reference frequency of 250 MHz, at which the settling time becomes infinitive and, when the measures according to the invention are carried out, 333 MHz, or a gain of >30%. This gain represents a significant rise in striving for reference frequencies which are as high as possible.

Figure 9:
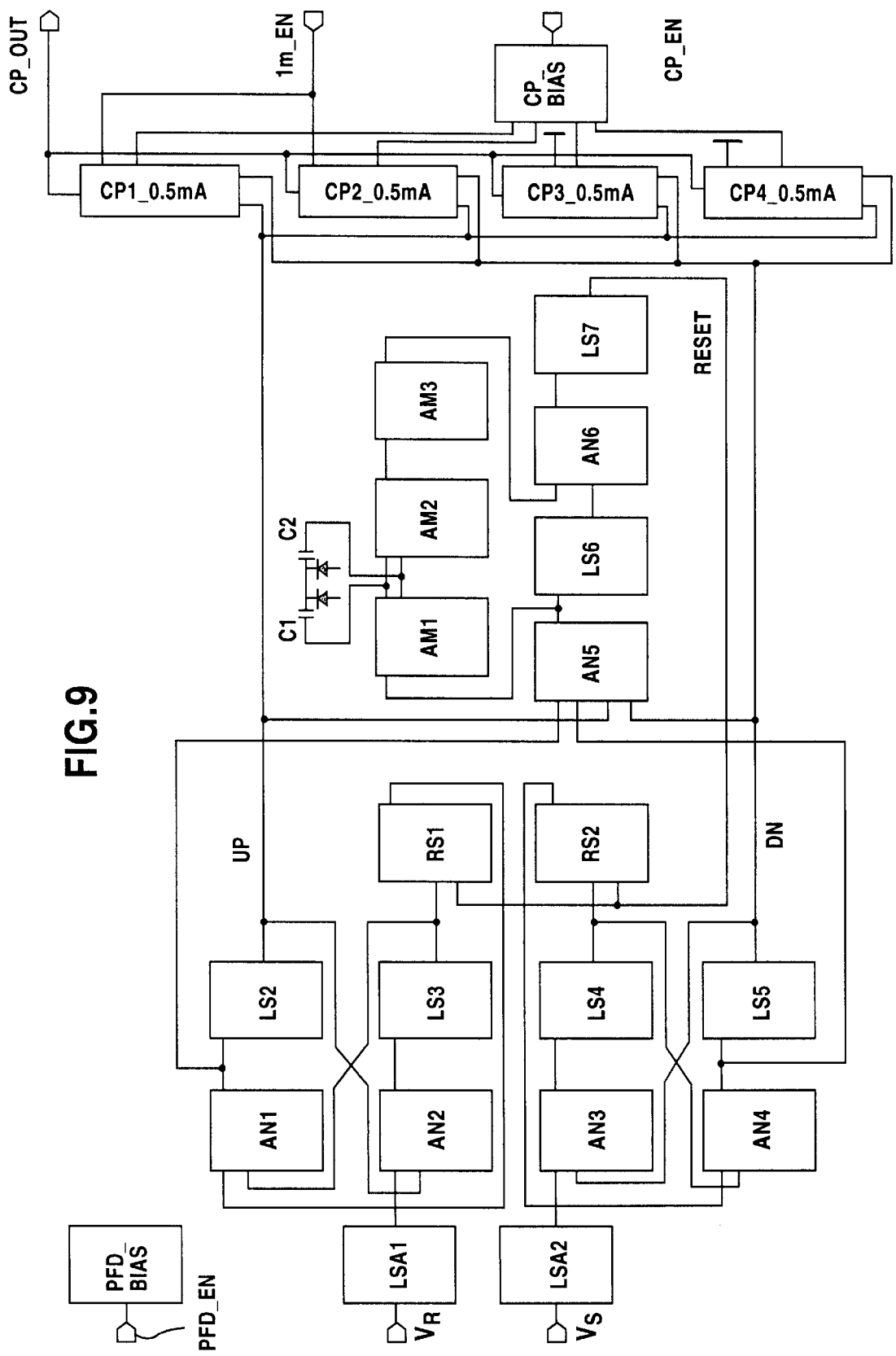
FIG. 9 is a block diagram of the circuit, provided in more detail, of an exemplary embodiment of the digital phase-frequency detector with the anti-backlash pulse and the shortened RESET.

FIG. 9 shows in a diagrammatic representation the configuration of the digital phase-frequency detector according to the invention with an anti-backlash pulse and shortened RESET. The following blocks are provided in accordance with this:
PFD_bias: Control voltage setting of the standard logic,
CP_bias: Control current setting of the charge pump cells,
CPx_0.5 mA: Charge pump for 0.5 mA sources/sinks current,
LS . . . : Standard logic level shifter,
AN . . . : Standard logic AND,
RS . . . : Standard logic RS flip flop circuit, and
AM . . . : Standard logic difference amplifier.

In this case, the block AN5 corresponds to the AND logic circuit 9 from FIG. 8. The path AM1-AM2-AM3 corresponds to the delay path 11 from FIG. 8 for positive pulse edges with two capacitors C1 and C2 for setting the delay time in the path. The path AN5-LS6-AN6-LS7 corresponds to the delay path 12 from FIG. 8 for negative pulse edges with a shortened delay duration.

The remaining standard logic cells correspond to the D flip flop circuits 5 and 6 with RESET input R from FIG. 8. The four charge pump cells CP1 to CP4 for in each case 0.5 mA sources/sinks current can be switched with a signal 1m_EN as a 1 mA or 2 mA output, the block CP_bias controlled from the biasing input CP_EN serving to set the control current of the charge pump cells CP1 to CP4. The circuit according to FIG. 9 is configured per se for differential operation. For the sake of simplicity, however, the differential line routing has been replaced in the drawing by single lines.

Figure 10:
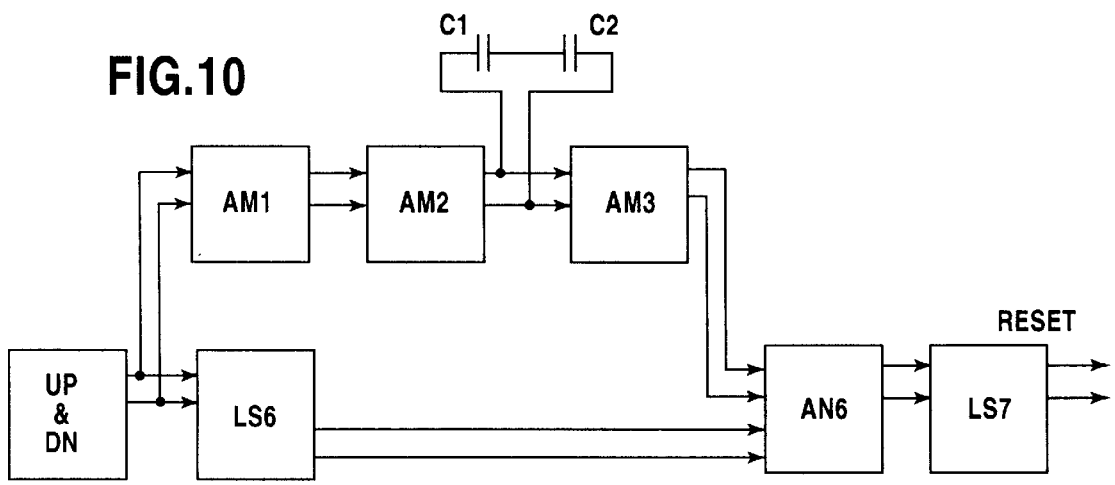
FIG. 10 is a block diagram of delay paths of the exemplary embodiment, shown in FIG. 9, of the phase-frequency detector.
Figure 11:
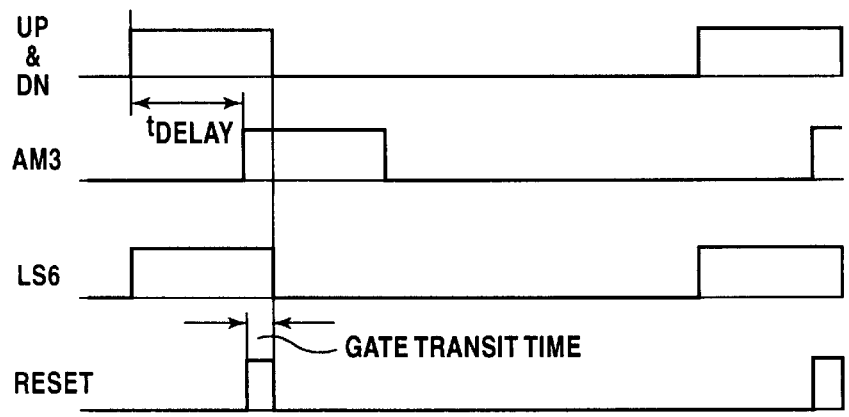
FIG. 11 is a pulse characteristic diagram for explaining a mode of operation of the delay paths according to FIG. 10.

FIG. 10 shows the two delay paths, already described, in a section of the overall circuit according to FIG. 9. The mode of operation of these two delay paths in the case of a digital phase-frequency detector according to the invention becomes clear from the pulse characteristics represented one below another in FIG. 11.

The gate transit times inside the block diagram represented in FIG. 10 are neglected in the pulse characteristics. The gate transit time specified in FIG. 11 relates to the delay between RESET→"1" and (UP & DN)→"0". It becomes clear from FIG. 11 that the length of the RESET pulse is clearly shortened by comparison with the delay time duration $t_{delay}$. FIG. 10 shows only one possibility of configuring the delay paths for the positive and negative pulse edges. Alternative embodiments can be implemented.

We claim:

1. A digital phase-frequency detector for generating a pulsed output current signal dependent on a phase difference between two ac input signals, comprising:

a first flip flop circuit having a reset input, a set input being fed one of the two ac input signals, and an output outputting digital output pulses that can be tapped as a function of a circuit state of said first flip-flop circuit;

a second flip-flop circuit having a reset input, a set input being fed another one of the two ac input signals, and an output outputting digital output pulses that can be tapped as a function of a circuit state of said second flip-flop circuit;

an AND logic circuit receiving the digital output pulses of said first and said second flip flop circuits and having an output outputting modified digital output pulses;

a delay device receiving the modified digital output pulses from said AND logic circuit and outputting a delay device signal received by said reset inputs of said first and second flip-flop circuits, said delay device increases a minimum duration of the modified digital output pulses by an anti-backlash pulse width given a presence of small phase differences between the two ac input signals, said delay device having a first delay path and a second delay path disposed parallel to one another, said first delay path assigned to positive edges of the modified digital output pulses coming from said output of said AND logic circuit and having a delay time unchanged by comparison with an original delay time, that is to say has a duration of the anti-backlash pulse, said second delay path assigned to negative edges of the modified digital output pulses coming from said output of said AND logic circuit and delays the negative edges by a delay time dimensioned to be only so long that said first and second flip-flop circuits being reliably reset; and a charge pump formed of two switchable current sources, including a first current source and a second current source, said first current source supplying a first predetermined current in dependence on the digital output pulses of said first flip-flop circuit, and said second current source draws a second predetermined in dependence on the digital output pulses current from said second flip-flop circuit and the first and second predetermined currents form the pulsed output current signal in a ternary shape in a temporal variation.

2. The digital phase-frequency detector according to claim 1, wherein said first and second flip-flop circuits are D flip-flop circuits.

3. The digital phase-frequency detector according to claim 1, wherein the delay time of said second delay path is formed by gate transit times.

4. The digital phase-frequency detector according to claim 1, wherein said delay time of said first delay path is at least equal to a minimum duration of the digital output pulses received by said two switchable current sources from said first and said second flip-flop circuits and required to switch on said two switchable current sources.

5. The digital phase-frequency detector according to claim 4, wherein the delay time of said first delay path is slightly longer than the minimum duration of the digital output pulses of said first and second flip-flop circuits.

6. The digital phase-frequency detector according to claim 1, including an integrator receiving the pulsed output current signal and converting the pulsed output current signal into a steady output control voltage.

7. A digital phase-locked control loop, comprising:

a digital phase-frequency detector generating a pulsed output current signal dependent on a phase difference between two ac input signals, said digital phase-frequency detector including:

a first flip flop circuit having a reset input, a set input being fed one of the two ac input signals, and an output outputting digital output pulses that can be tapped as a function of a circuit state of said first flip-flop circuit;

a second flip-flop circuit having a reset input, a set input being fed another one of the two ac input signals, and an output outputting digital output pulses that can be tapped as a function of a circuit state of said second flip-flop circuit;

an AND logic circuit receiving the digital output pulses of said first and said second flip flop circuits and having an output outputting modified digital output pulses;

a delay device receiving the modified digital output pulses from said AND logic circuit and outputting a delay device signal received by said reset inputs of said first and second flip-flop circuits, said delay device increases a minimum duration of the modified digital output pulses by an anti-backlash pulse width given a presence of small phase differences between the two ac input signals, said delay device having a first delay path and a second delay path disposed parallel to one another, said first delay path assigned to positive edges of the modified digital output pulses coming from said output of said AND logic circuit and having a delay time unchanged by comparison with an original delay time, that is to say has a duration of the anti-backlash pulse, said second delay path assigned to negative edges of the modified digital output pulses coming from said output of said AND logic circuit and delays the negative edges by a delay time dimensioned to be only so long that said first and second flip-flop circuits being reliably reset; and a charge pump formed of two switchable current sources, including a first current source and a second current source, said first current source supplying a first predetermined current in dependence on the digital output pulses from said first flip-flop circuit, and said second current source draws a second predetermined current in dependence on the digital output pulses from said second flip-flop circuit and the first and second predetermined currents form the pulsed output current signal in a ternary shape in a temporal variation;

an integrator forming an analog loop filter receiving the pulsed output current signal from said charge pump and converting the pulsed output current signal into a steady output control voltage; and a voltage-controlled oscillator receiving, as a control voltage for frequency resetting, the steady output control voltage from said integrator, said voltage-controlled oscillator forming, and generating the other of two ac input signals received by said set input of said second flip-flop circuit, and the one of said two ac input signals received by said set input of said first flip-flop circuit being a reference ac voltage.

8. The digital phase-locked control loop according to claim 7, including a frequency divider disposed between said second flip-flop circuit and said charge pump.

9. An integrated circuit module, comprising:

a digital phase-frequency detector for generating a pulsed output current signal dependent on a phase difference between two ac input signals, said digital phase-frequency detector including:

a first flip flop circuit having a reset input, a set input being fed one of the two ac input signals, and an output outputting digital output pulses that can be tapped as a function of a circuit state of said first flip-flop circuit;

a second flip-flop circuit having a reset input, a set input being fed another one of the two ac input signals, and an output outputting digital output pulses that can be tapped as a function of a circuit state of said second flip-flop circuit;

an AND logic circuit receiving the digital output pulses of said first and said second flip flop circuits and having an output outputting modified digital output pulses;

a delay device receiving the modified digital output pulses from said AND logic circuit and outputting a delay device signal received by said reset inputs of said first and second flip-flop circuits, said delay device increases a minimum duration of the modified digital output pulses by an anti-backlash pulse width given a presence of small phase differences between the two ac input signals, said delay device having a first delay path and a second delay path disposed parallel to one another, said first delay path assigned to positive edges of the modified digital output pulses coming from said output of said AND logic circuit and having a delay time unchanged by comparison with an original delay time, that is to say has a duration of the anti-backlash pulse, said second delay path assigned to negative edges of the modified digital output pulses coming from said output of said AND logic circuit and delays the negative edges by a delay time dimensioned to be only so long that said first and second flip-flop circuits being reliably reset; and a charge pump formed of two switchable current sources, including a first current source and a second current source, said first current source supplying a first predetermined current in dependence on the digital output pulses of said first flip-flop circuit, and said second current source draws a second predetermined current in dependence on the digital output pulses from said second flip-flop circuit and the first and second predetermined currents form a pulsed output current signal in a ternary shape in a temporal variation.

* * * * *